(12) United States Patent
Horng et al.

(10) Patent No.: US 7,948,044 B2
(45) Date of Patent: May 24, 2011

(54) LOW SWITCHING CURRENT MTJ ELEMENT FOR ULTRA-HIGH STT-RAM AND A METHOD FOR MAKING THE SAME

(75) Inventors: Cheng T. Horng, San Jose, CA (US); Ru-Ying Tong, Los Gatos, CA (US); Yimin Guo, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 223 days.

(21) Appl. No.: 12/082,155

(22) Filed: Apr. 9, 2008

(65) Prior Publication Data
US 2009/0256220 A1 Oct. 15, 2009

(51) Int. Cl.
*H01L 29/82* (2006.01)

(52) U.S. Cl. ............... 257/421; 257/295; 257/E29.323; 257/E27.006; 257/E27.108; 977/883

(58) Field of Classification Search .............. 257/421, 257/E29.392, E29.323, 295, E27.006, E27.108; 977/883
See application file for complete search history.

(56) References Cited

U.S. PATENT DOCUMENTS

| | | | |
|---|---|---|---|
| 6,778,363 B2 | 8/2004 | Meguro et al. | |
| 7,009,877 B1 | 3/2006 | Huai et al. | |
| 7,126,202 B2 | 10/2006 | Huai et al. | |
| 7,270,896 B2 | 9/2007 | Parkin | |
| 2004/0084400 A1 | 5/2004 | Costrini et al. | |
| 2005/0041462 A1 | 2/2005 | Kent et al. | |
| 2005/0136600 A1 | 6/2005 | Huai | |
| 2005/0254286 A1 | 11/2005 | Valet | |
| 2007/0063236 A1 | 3/2007 | Huai et al. | |
| 2007/0148786 A1 | 6/2007 | Horng et al. | |
| 2008/0061388 A1 | 3/2008 | Diao et al. | |

FOREIGN PATENT DOCUMENTS

WO   PCT/US 09/01578   4/2009

OTHER PUBLICATIONS

"Current-driven excitation of magnetic multilayers," by Slonczewski, Journal of Magnetism and Magnetic Materials, V 159(1996) L1-L7, Elsevier Science B.V.

(Continued)

*Primary Examiner* — Long K Tran
(74) *Attorney, Agent, or Firm* — Saile Ackerman LLC; Stephen B. Ackerman

(57) ABSTRACT

A STT-RAM MTJ that minimizes spin-transfer magnetization switching current (Jc) while achieving a high dR/R is disclosed. The MTJ has a MgO tunnel barrier formed by natural oxidation to achieve a low RA, and a CoFeB/FeSiO/CoFeB composite free layer with a middle nanocurrent channel layer to minimize $Jc_0$. There is a thin Ru capping layer for a spin scattering effect. The reference layer has a shape anisotropy and Hc substantially greater than that of the free layer to establish a "self-pinned" state. The free layer, capping layer and hard mask are formed in an upper section of a nanopillar that has an area substantially less than a lower pedestal section which includes a bottom electrode, reference layer, seed layer, and tunnel barrier layer. The reference layer is comprised of an enhanced damping constant material that may be an insertion layer, and the free layer has a low damping constant.

16 Claims, 5 Drawing Sheets

OTHER PUBLICATIONS

"A Novel Nonvolatile Memory with Spin Torque Transfer Magnetization Switching: Spin-RAM," by Hosomi et al., 2005 IEDM, paper 19-1.

"Composite free layer for high denstiy magnetic random access memory with lower spin transfer current," by Meng et al., Applied Physics Letters 89, 152509 (2006), pp. 1-3, 2006 American Institute of Physics.

"Current-induced magnetization switching in MgO barrier based magnetic tunnel junctions with CoFeB/Ru/CoFeB synthetic ferrimagnetic free layer," by J. Hayakawa et al., found, j-hayakawa@rd.hitachi.co.jp.

"Enhanced Gilbert Damping in Thin Ferromagnetic Films, " by Y. Tserkovnyak et al., Physical Review Letters, vol. 88, No. 11, Mar. 18, 2002, 1176071-0 to 1176071-4, 2002 The American Physical Society.

"Currents, torques, and polarization factors in magnetic tunnel junctions," by Slonczewski, Physical Review B 71, 024411-1 to 024411-10, (2005), 2005 The American Physical Society.

"Perpendicular giant magnetoresistance and magetic switching properties of a single spin valve with a synthetic antiferromagnet as a free layer," by Jiang et al., Physical Review B 68, 224426-1 to 224426-7, 2003 The American Physical Society.

"Effective Reduction of Critical Current for Current-Induced Magnetization Switching by a Ru Layer Insertion in an Exchange-Biased Spin Valve," by Jiang et al., Physical Review Letters, vol. 92, No. 16, Apr. 23, 2004, 167204-1 to 167204-4, 2004 The American Physical Society.

"Discinctive current-induced magnetization switching in a current-perpendicular-to-place giant-magnetoresistance nanopiller with a synthetic antiferromagnet free layer," by Ochiai et al., Applied Physics Letters 86, 242506-1 to 242506-3, 2005 American Institute of Physics.

"Reduction of spin transfer by synthetic antiferromagnets," by Emley et al., Applied Physics Letters, vol. 84, No. 21, May 24, 2004, pp. 4257-4259.

"Effect of high annealing temperature on giant tunnel magnetoresistance ratio of CoFeB/MgO/CoFeB magnetic tunnel junctions," by Hayakawa et al., Applied Physics Letters 89, 232510-1 to 232510-3, 2006 American Institute of Physics.

Co-pending, U.S. Appl. No. 12/079,445, filed Mar. 27, 2008, "A Low Switching Current Dual Spin Filter (DSF) Element for STT-RAM and a Method for Makin the Same," assigned to the same assignee as the present invention.

LOW SWITCHING CURRENT MTJ ELEMENT FOR ULTRA-HIGH STT-RAM AND A METHOD FOR MAKING THE SAME

RELATED PATENT APPLICATION

This application is related to the following: Ser. No. 12/079,445, filing date Mar. 27, 20008, assigned to a common assignee and herein incorporated by reference in its entirety.

FIELD OF THE INVENTION

The invention relates to a high performance Magnetic Tunneling Junction (MTJ) element and a method for making the same, and in particular, to a spin transfer (Spin-RAM) device that achieves low switching current and high dR/R by incorporating a CoFe fixed layer having large shape anisotropy with a free layer having a nanocurrent channel FeSiO layer, and a thin Ru capping layer.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, and Flash. Similarly, spin-transfer (spin torque) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-RAM on a gigabit scale.

Both MRAM and STT-RAM have a MTJ element based on a tunneling magneto-resistance (TMR) effect wherein a stack of layers has a configuration in which two ferromagnetic layers are separated by a thin non-magnetic dielectric layer. The MTJ element is typically formed between a bottom electrode such as a first conductive line and a top electrode which is a second conductive line at locations where the top electrode crosses over the bottom electrode. A MTJ stack of layers may have a bottom spin valve configuration in which a seed layer, an anti-ferromagnetic (AFM) pinning layer, a ferromagnetic "pinned" layer, a thin tunnel barrier layer, a ferromagnetic "free" layer, and a capping layer are sequentially formed on a bottom electrode. The AFM layer holds the magnetic moment of the pinned layer in a fixed direction. The pinned layer has a magnetic moment that is fixed in the "y" direction, for example, by exchange coupling with the adjacent AFM layer that is also magnetized in the "y" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("1" memory state) and a higher resistance is noted when they are in an anti-parallel state or "0" memory state.

In a read operation, the information stored in a MRAM cell is read by sensing the magnetic state (resistance level) of the MTJ element through a sense current flowing top to bottom through the cell in a current perpendicular to plane (CPP) configuration. During a write operation, information is written to the MRAM cell by changing the magnetic state in the free layer to an appropriate one by generating external magnetic fields as a result of applying bit line and word line currents in two crossing conductive lines, either above or below the MTJ element. One line (bit line) provides the field parallel to the easy axis of the bit while another line (digit line) provides the perpendicular (hard axis) component of the field. The intersection of the lines generates a peak field that is engineered to be just over the switching threshold of the MTJ.

A high performance MRAM MTJ element is characterized by a high tunneling magnetoresistive (TMR) ratio which is dR/R where R is the minimum resistance of the MTJ element and dR is the change in resistance observed by changing the magnetic state of the free layer. A high TMR ratio and resistance uniformity (Rp_cov), and a low switching field (Hc) and low magnetostriction ($\lambda_s$) value are desirable for conventional MRAM applications. For Spin-RAM (STT-RAM), a high $\lambda_s$ and high Hc leads to high anisotropy for greater thermal stability. This result is accomplished by (a) well controlled magnetization and switching of the free layer, (b) well controlled magnetization of a pinned layer that has a large exchange field and high thermal stability and, (c) integrity of the tunnel barrier layer. In order to achieve good barrier properties such as a specific junction resistance x area (RA) value and a high breakdown voltage (Vb), it is necessary to have a uniform tunnel barrier layer which is free of pinholes that is promoted by a smooth and densely packed growth in the AFM and pinned layers. RA should be relatively small (<10000 ohm-$\mu m^2$) for MTJs that have an area defined by an easy axis and hard axis dimensions of less than 1 micron. Otherwise, R would be too high to match the resistance of the transistor which is connected to the MTJ.

As the size of MRAM cells decreases, the use of external magnetic fields generated by current carrying lines to switch the magnetic moment direction becomes problematic. One of the keys to manufacturability of ultra-high density MRAMs is to provide a robust magnetic switching margin by eliminating the half-select disturb issue. For this reason, a new type of device called a spin transfer (spin torque) device was developed. Compared with conventional MRAM, spin-transfer torque or STT-RAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. The difference between a STT-RAM and a conventional MRAM is only in the write operation mechanism. The read mechanism is the same.

In order for conventional MRAM and STT-RAM to be viable in the 90 nm technology node and beyond, MTJs must exhibit a TMR ratio that is much higher than in a conventional MRAM-MTJ which uses AlOx as the tunnel barrier and a NiFe free layer. Furthermore, the critical current density (Jc) must be lower than $10^6$ A/cm$^2$ to be driven by a CMOS transistor that can typically deliver 100 µA per 100 nm gate width. A critical current for spin transfer switching (Ic), which is defined as [(Ic$^+$+Ic$^-$I)/2], for the present 180 nm node sub-micron MTJ having a top-down area of about 0.2× 0.4 micron, is generally a few milliamperes. The critical current density (Jc), for example (Ic/A), is on the order of several 10$^7$ A/cm$^2$. This high current density, which is required to induce the spin-transfer effect, could destroy a thin tunnel barrier made of AlOx, MgOx, or the like. Thus, for high density devices such as STT-RAM on a gigabit scale, it is desirable to decrease Ic (and its Jc) by more than an order of magnitude so as to avoid an electrical breakdown of the MTJ device and to be compatible with the underlying CMOS transistor that is used to provide switching current and to select a memory cell.

Once a certain MTJ cell has been written to, the circuits must be able to detect whether the MTJ is in a high or low resistance state which is called the "read" process. Uniformity of the TMR ratio and the absolute resistance of the MTJ cell are critical in MRAM (and STT-RAM) architecture since the absolute value of MTJ resistance is compared with a reference cell in a fixed resistance state during read mode. Needless to say, the read process introduces some statistical difficulties associated with the variation of resistances of MTJ cells within an array. If the active device resistances in a block of memory show a large resistance variation (i.e. high Rp_cov, Rap_cov), a signal error can occur when they are compared with a reference cell. In order to have a good read operation margin, TMR/Rp_cov (or Rap_cov) should have a minima of 12, preferably >15, and most preferably >20 where Rp is the MTJ resistance for free layer magnetization aligned parallel to pinned layer magnetization (which is fixed) and Rap is the resistance of free layer magnetization aligned anti-parallel to the pinned layer magnetization.

The intrinsic critical current density (Jc) as given by Slonczewski of IBM is shown in equation (1) below.

$$Jc = 2 \, e\alpha Ms \, t_F (Ha + H_k + 2\pi Ms)/h\eta \quad (1)$$

where e is the electron charge, $\alpha$ is a Gilbert damping constant, $t_F$ is the thickness of the free layer, h is the reduced Plank's constant, $\eta$ is the spin-transfer efficiency which is related to the spin polarization (P), Ha is the external applied field, $H_k$ is the uniaxial anisotropy field, and $2\pi$ Ms is the demagnetization field of the free layer. Two publications by C. Slonczewski that relate to STT-RAM are entitled "Current driven excitation of magnetic multilayers", J. Magn. Magn. Mater. V 159, L1-L7 (1996), and "Current, torques, and polarization factors in magnetic tunnel junctions", Physical Review B 71, 024411(2005). In a MTJ structure (F/I/F) where F is a ferromagnetic layer and I is an insulator, when the spin relaxation distance is much larger than the ferromagnetic film thickness, the spin continuity holds true, i.e., the sum of interfacial torques from both left and right sides equals the net inflow of spin current. As the magnetization is fixed on one side, the other side magnetization will experience an in-plane torque of $T = -(hP_L J_0/2e)\sin(\theta)$ where e is the electron charge, $P_L$ is tunneling polarization parameter, $J_0$ is electric current density, and $\theta$ is the angle between the magnetizations on the two sides of the tunnel barrier (insulator).

Normally, the demagnetizing field, $2\pi$Ms (several thousand Oe term) is much larger than the uniaxial anisotropy field Hk and external applied field (approximately 100 Oe) Ha term, hence the effect of Hk and Ha on Jc are small. In equation (2), V equals Ms($t_F$A) and is the magnetic volume which is related to the thermal stability function term $K_u V/k_b T$ where $K_u$ is the magnetic anisotropy energy and $k_b$ is the Boltzmann constant.

$$Jc \propto \alpha Ms V/h\eta \quad (2)$$

Referring to FIG. 1, a STT-RAM structure 1 is shown and includes a gate 5 formed above a p-type semiconductor substrate 2, a source 3, drain 4, word line (WL) 7 connected to the source by a first via stud 6, and a source line 9 connected to the transistor drain by a second via stud 8. There is also a bottom electrode (BE) 10 formed on the source line 9, a MTJ cell 11 contacting the BE, and a bit line (BL) 12 above on the MTJ cell.

Another publication relating to a STT-RAM (Spin-RAM) structure is by M. Hosomi et al. in "A novel non-volatile memory with spin torque transfer magnetization switching: Spin-RAM", 2005 IEDM, paper 19-1, and describes a 4 Kbit Spin RAM having CoFeB pinned and free layers, and a RF-sputtered MgO tunnel barrier that was annealed under 350° C. and 10000 Oe conditions. The MTJ size is 100 nm×150 nm in an oval shape. The tunnel barrier is made of crystallized (001) MgO with a thickness controlled to <10 Angstroms for a proper RA of around 20 ohm-um$^2$. Intrinsic dR/R of the MTJ stack is 160% although dR/R for the 100 nm×150 nm bit during read operation (with 0.1 V bias) is about 90% to 100%. Using a 10 ns pulse width, the critical current density, Jc, for spin transfer magnetization switching is around 2.5×10$^6$ A/cm$^2$. Write voltage distribution on a 4 Kbit circuit for high resistance state to low resistance (P to AP) and low resistance state to high resistance state (AP to P) has shown good write margin. Resistance distribution for the low resistance state (Rp) and high resistance state (Rap) has a sigma (Rp_cov) of about 4%. Thus, for a read operation, TMR (with 0.1 V bias)/Rp_cov is >20.

H. Meng and J. Wang in "Composite free layer for high density magnetic random access memory with low spin transfer current", APL Vol. 89, pp. 152509 (2006), fabricated two sets of MTJs. In a first MTJ represented by Si/SiO$_2$/BE/Ta/IrMn/CoFe/AlOx/CoFe30/Ta/top electrode, they employ a single CoFe free layer that is 30 Angstroms thick. In a second MTJ represented by Si/SiO$_2$/BE/Ta/CoFe20/FeSiO30/CoFe10/AlOx/CoFe/Ru/CoFe/IrMn/Ta/top electrode, there is a composite free layer with a nanocurrent (NCC) FeSiO layer sandwiched between two CoFe layers. RA values are 4.2 ohm-μm$^2$ and 7 ohm-μm$^2$, and TMR ratios are around 16.5% and 10% for the first MTJ and second MTJ, respectively. It is interesting to note that the Jc$_0$ value (by extrapolation) of 8×10$^6$ A/cm$^2$ for the second MTJ is about 33% less than that of the first MTJ (2.4×10$^7$ A/cm$^2$).

In two related publications by Y. Jiang et al., entitled "Perpendicular giant magnetoresistance and magnetic switching properties of a single spin valve with a synthetic antiferromagnet as a free layer", Phys. Rev. B, Vol. 68, p. 224426 (2003), and "Effective reduction of critical current for current-induced magnetization switching by a Ru layer insertion in an exchange-biased spin valve", PRL, V. 92, p. 167204 (2004), that relate to current induced magnetization switching (CIMS) in nanopillar CPP-GMR structures, a thin Ru layer formed on a CoFe free layer was found to considerably lower the critical current (Jc).

T. Ochiai et al. in "Distinctive current induced magnetization switching in a current-perpendicular to plane giant magnetoresistance nanopillar with a synthetic antiferromagnetic free layer, APL Vo. 86, p. 242506 (2005), showed that depending on the relative thickness between F1 and F2 free layers, CIMS is observed only in one side of the current regime. Thus, a spin valve fabricated with a synthetic free layer having a F1/coupling/F2 configuration is not suitable for STT-RAM.

The Jc$_0$ for a MTJ with a synthetic free layer (CoFeB/Ru/CoFeB) was found to be about 3× larger than that for a MTJ having a single CoFeB layer in a paper by J. Hayakawa et al.

entitled "Current induced magnetization switching in MgO barrier based magnetic tunnel junctions with CoFeB/Ru/CoFeB synthetic free layer", J-hayakawa@rd.hitachi.co.jp.

N. C. Emley et al. in "Reduction of spin transfer by synthetic antiferromagnets", APL, V. 84, p. 4257 (2004), the dR/R for a SyAF-CPP spin valve (magnetic nanopillar) having a $[Co_{(bottom)}/Ru/Co_{(fixed)}]/Cu/CoFe_{free}$ configuration was found to be only one half the dR/R for a spin valve having a single pinned layer in a $Co_{fixed}/Cu/CoFe_{free}$ configuration.

J. Hayakawa et al. in "Effect of high annealing temperature on giant tunnel magnetoresistive ratio of CoFeB/MgO/CoFeB magnetic tunnel junctions", Appl. Phys. Lett., 89, 232510 (2006), showed dR/R~450% for the pseudo spin valve (pinned layer not exchanged biased by an AFM layer) annealed at 450° C. For the standard exchange biased (EB) spin valve, the highest dR/R is about 350% for a 375° C. annealed MTJ. Energy dispersive X-ray analysis shows that annealing at >375° C. induces interdiffusion of Mn atoms from IrMn AFM layers into the MgO barrier and ferromagnetic layers in EB spin valves.

In summary, the prior art suggests that (a) $Jc_0 > 2 \times 10^6$ A/cm$^2$ for a conventional MgO-MTJ fabricated with a single "barrier" layer, (b) a MTJ fabricated with a NCC free layer can reduce $Jc_0$, (c) insertion of a thin Ru layer on a free layer in a CPP-GMR device can considerably lower Jc and greatly enhance dR/R, (d) dR/R of a SyAF(pinned)-CPP spin valve suffers greatly, (e) CPP-GMR and CPP-MTJ made with a synthetic free layer is not suitable for STT-RAM, and (f) increasing annealing temperature induces interdiffusion of Mn into the MgO barrier to reduce dR/R in an exchange biased spin valve.

Further improvement in STT-RAM technology is necessary before a viable product based on the 90 nm technology node is achieved. In particular, a combination of a high TMR ratio, TMR/Rp_cov ratio>15, and a low Jc of less than $2 \times 10^6$ A/cm$^2$ is needed.

In U.S. Patent Application No. 2007/0148786, a method of forming a MgO tunnel barrier is disclosed that involves deposition of a Mg layer followed by a natural oxidation process.

U.S. Pat. No. 6,778,363, U.S. Pat. No. 7,126,202, and U.S. Pat. No. 7,270,896 all describe methods of forming a MgO tunnel barrier layer.

SUMMARY OF THE INVENTION

One objective of the present invention is to provide a MTJ nanopillar structure for STT-RAM applications that delivers a high dR/R of about 100% and achieves a low $Jc_0$ of less than about $2 \times 10^6$ A/cm$^2$ to facilitate magnetization switching of the free layer without negatively affecting the tunnel barrier layer.

A second objective of the present invention is to provide a high density STT-RAM comprised of a MTJ nanopillar structure according to the first objective by employing a fabrication sequence that can be readily incorporated into existing manufacturing lines.

According to one embodiment, these objectives are achieved by providing a substrate comprised of a bottom conductor electrode on which a spin-transfer (STT)-RAM structure is to be fabricated. In order to achieve a high density STT-RAM on a gigabit scale, the bottom electrode is preferably disposed on a via stud that is formed in a first dielectric layer and contacts a transistor drain in a sub-structure. A MTJ element is formed on the bottom electrode and includes a stack of layers. In one aspect, the MTJ stack has a bottom spin valve configuration in which the seed layer, reference layer, tunnel barrier layer, free layer, and a capping layer are sequentially formed on the bottom electrode. Furthermore, the reference layer in the MTJ element should have a shape anisotropy and a coercive force (Hc) substantially greater than that of the overlying free layer, and a thickness at least twice that of the free layer. The tunnel barrier layer is preferably comprised of crystalline MgO made by a natural oxidation method in order to minimize the RA value. Above the tunnel barrier layer is a free layer that is a composite comprised of a nanocurrent channel (NCC) layer such as FeSiO sandwiched between two soft magnetic layers. Preferably, there is a thin Ru capping layer formed on the free layer such that the Ru serves as a spin scattering layer. A Ta hard mask is disposed on the Ru capping layer to complete the MTJ stack of layers.

In one embodiment, the reference layer is not a synthetic anti-ferromagnetic (SyAF) layer so as not to degrade the dR/R of the MTJ. The reference layer may be represented by X/M where X is a material that induces a high damping constant in the overlying ferromagnetic layer "M". X is a transition metal such as Tb, Gd, Pt, Pd, Ta, Hf, Os, Nb, Rh, Ru, or the like and M is Fe, Co, Ni, B, or an alloy thereof. Alternatively, the reference layer may be a composite represented by $M_1/X/M_2$ where $M_1$ is a lower reference layer, X is a middle insertion layer which induces a high damping constant in $M_1$ and $M_2$ layers, and $M_2$ is an upper reference layer where $M_1$ and $M_2$ are Fe, Co, Ni, B, or an alloy thereof. The reference layer and tunnel barrier layer form a lower pedestal section of the MTJ nanopillar structure and have a first area size from a top view while the remaining layers in the MTJ form an upper section in the nanopillar structure and have a second area size from a top view in which the second area size is substantially smaller than the first area size.

The present invention encompasses a second embodiment in which the MTJ nanopillar structure is comprised of a seed layer, SyAF reference layer, tunnel barrier layer, free layer, capping layer, and hard mask that are sequentially formed on the bottom electrode. The MTJ nanopillar structure has a lower pedestal section which includes the seed layer, SyAF reference layer, and tunnel barrier layer, but an AFM layer is omitted. An upper section of the MTJ nanopillar is made of the free layer, capping layer, and hard mask and has a second area size substantially smaller than the first area size of the lower pedestal section. The SyAF reference layer has a lower magnetic layer, a middle non-magnetic coupling layer, and an upper composite reference magnetic layer having a highly enhanced damping constant that is anti-parallel coupled to the lower magnetic layer.

There is a third embodiment in which the MTJ nanopillar structure in the second embodiment is modified so that the upper section of the nanopillar has essentially the same shape and area size as that of the lower section of the nanopillar structure. In this case, the dipole field from the SyAF reference layer is greatly reduced. Therefore, it is not necessary to have a substantial difference in area size between the upper nanopillar section and lower pedestal section.

All of the layers in the MTJ stacks of the three embodiments may be formed by sputtering or ion beam deposition (IBD). The tunnel barrier layer is preferably MgO made by a natural oxidation process of a Mg layer. Once all the layers in the stack are laid down, a thermal anneal process may be employed to fix the reference layer magnetization (easy-axis) direction. A first patterning and etching sequence is followed to fabricate the upper section of the MTJ nanopillar. Thereafter, a second patterning and etching sequence is used to form the lower pedestal section.

In one embodiment, a first photoresist layer is formed on the hard mask and patterned to define an array of nanomagnet shapes from a top-view. Then a reactive ion etch (RIE) process is employed to etch through portions of the hard mask that are not covered by the first photoresist layer. The first photoresist layer may then be removed and a second RIE step is used to selectively etch through portions of the capping layer and free layer that are not protected by the hard mask. Next, a conformal silicon nitride passivation layer is laid down insitu on the MgO tunnel barrier and on the upper section that includes the free layer, capping layer, and hard mask. A second photoresist layer is then coated and patterned on the silicon nitride layer to form an array of islands wherein each island has a cross-sectional area from a top view that corresponds to the desired area and shape of the pedestal section in a MTJ nanopillar. Thus, one island of second photoresist is formed above each upper section of a partially formed MTJ nanopillar and preferably above a via stud in the first dielectric layer. Then a third RIE process is used to selectively remove portions of the MgO tunnel barrier, reference layer, seed layer, and bottom electrode that are not protected by the second photoresist layer. After the third RIE step is completed, the second photoresist layer is stripped to form the completed MTJ nanopillar. The silicon nitride layer advantageously remains along the sidewalls of the upper section in order to protect the free layer from oxidation.

To complete the STT-RAM structure, a second dielectric layer such as silicon oxide is deposited on the MTJ nanopillar and surrounding substrate which is the first dielectric layer. A chemical mechanical polish (CMP) process is used to expose the hard mask and make the second dielectric layer coplanar with the top of the nanomagnet pillar. A bit line array is then formed on the second dielectric layer by depositing a conductive layer followed by employing a photolithography patterning and RIE sequence to delineate a bit line on the hard mask.

DETAILED DESCRIPTION OF THE INVENTION

The present invention is a MTJ nanopillar structure that enables a combination of high dR/R and low critical current density which is necessary for enhanced performance in spin transfer (STT-RAM) applications. The present invention also provides a fabrication sequence for a STT-RAM device on an ultra high density scale. Drawings are provided by way of example and are not intended to limit the scope of the invention. Although the exemplary embodiment depicts a bottom spin valve configuration, the present invention also encompasses a top spin valve or dual spin valve design as appreciated by those skilled in the art. A "top view" as described herein is defined as a viewpoint from a position above the plane of the substrate in the STT-RAM device.

FIGS. 2-5 illustrate various embodiments of a MTJ nanomagnet pillar hereafter referred to as a MTJ nanopillar that is formed between a bottom electrode 32 and a bit line 42. The bottom electrode 32 may be a composite layer comprised of a lower seed layer, middle conductive layer, and upper capping layer (not shown) such as Ta/Ru/Ta. Alternatively, the bottom electrode 32 may be a single layer made of Ta, for example, as in the preferred embodiment of the present invention. An α-Ta bottom electrode 32 is especially advantageous in promoting a uniform and dense growth in subsequently formed MTJ layers that will yield a higher dR/R. According to one embodiment described herein, the bottom electrode will be subsequently patterned into a sectioned line having an elliptical shape or an elongated shape in an "x, y" plane and a thickness in a z-axis direction. The elongated shape refers to a shape having parallel sides in a middle section and curved end sections that connect the parallel sides.

Figure 1:
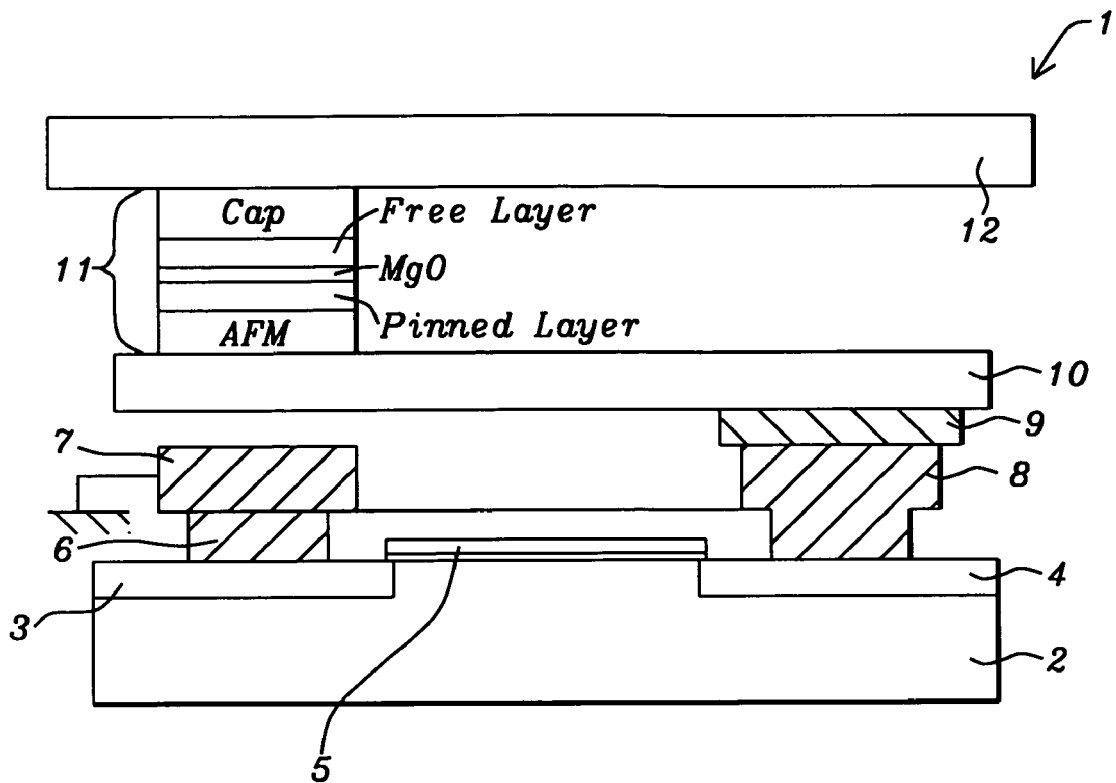
FIG. 1 is a cross-sectional view showing a memory cell in a conventional STT-RAM device.
Figure 2:
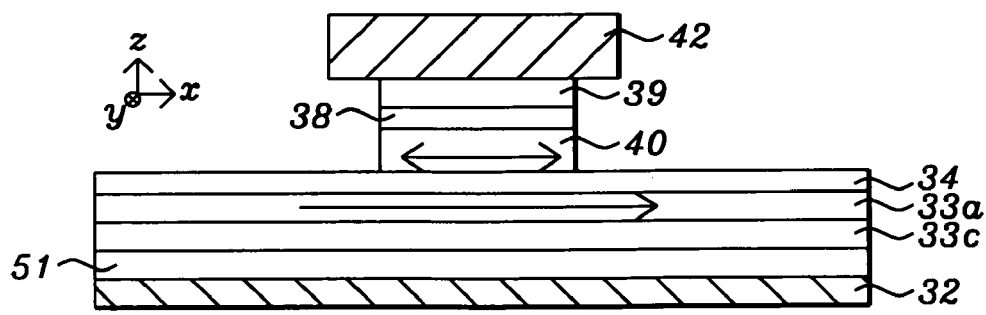
FIG. 2 is a cross-sectional view of a STT-RAM having a single reference layer with a highly enhanced damping constant according to a first embodiment of the present invention.

Referring to FIG. 2, there is a first embodiment of the present invention wherein the MTJ nanopillar is comprised of a lower section that includes a seed layer 51, a composite reference layer having an X/M configuration comprised of a lower "X" layer hereafter referred to as insertion layer 33c that is used to induce a highly enhanced damping constant in an upper "M" magnetic layer 33a made of Fe, Co, Ni, B, or an alloy thereof, and a tunnel barrier layer 34 preferably made of MgO. The upper magnetic layer 33a also known as the reference layer is configured to have a "self-pinned" magnetization that does not require an AFM layer. Conditions for "self-pinning" include a high Hc, high magnetostriction, and high damping in the self-pinned layer. Note that the terms "pinned" and "reference" are interchangeable in this description. In one example, the upper magnetic layer 33a may be comprised of CoFeB with a $\lambda_s$ of around $5 \times 10^{-5}$.

The seed layer 51 may be comprised of NiCr, NiFe, NiFeCr, or other suitable seed layer materials and when grown on an amorphous Ta bottom electrode 32, a smooth and dense (111) seed layer structure results that promotes smooth and densely packed growth in subsequently formed MTJ layers. The upper magnetic layer 33a has a thickness from 40 to 60 Angstroms and has a magnetic moment aligned along the x-axis (easy axis) direction in the exemplary embodiment. The insertion layer 33c may be comprised of Tb, Gd, Pt, Pd, Ta, Hf, Os, Nb, Rh, or Ru, and has a thickness between 10 and 40 Angstroms, and preferably between 10 and 20 Angstroms.

The lower section of the MTJ nanopillar has a first area size from a top view (not shown) that is substantially greater than a second area size (in the "x,y" plane) of the upper section which is comprised of a free layer 40, a thin capping layer 38, and a hard mask 39. Preferably, the upper magnetic layer 33a has a thickness at least twice as large as that of the overlying free layer 40 in order to provide a Hc value that is sufficiently large enough to establish a "self-pinned" state. In other words, the magnetic moment of upper magnetic layer 33a should be stable and not switched by the influence of other magnetic layers such as free layer 40.

Figure 3:
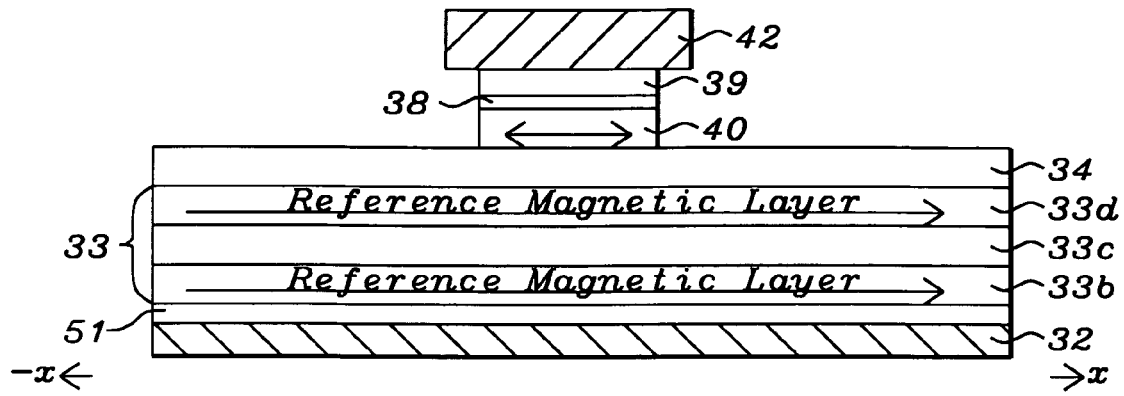
FIG. 3 is a cross-sectional view of a STT-RAM having a composite reference layer including an insertion layer according to one embodiment of the present invention.

Referring to FIG. 3, the first embodiment also encompasses a MTJ nanopillar comprised of a reference layer 33 which is a composite made of a lower $M_1$ reference layer 33b on the seed layer 51, a middle insertion layer 33c, and an upper $M_2$ reference layer 33d contacting the tunnel barrier layer 34 to give a $M_1/X/M_2$ configuration in which $M_1$ and $M_2$ are magnetic layers made of Co, Fe, Ni, B, or an alloy thereof, and X is an insertion layer that induces an enhanced damping constant in the $M_1$ and $M_2$ layers where X is Tb, Gd, Pt, Pd, Ta, Hf, Os, Nb, Rh, or Ru. The thickness of the middle insertion layer 33c is kept below 20 Angstroms and enables strong ferromagnetic coupling between the $M_1$ layer 33b and $M_2$ layers 33d.

The reference layers 33b, 33d may be comprised of the same magnetic material as in reference layer 33a. The damping constant for the reference layer 33 is enhanced by including the insertion layer 33c. Similar to reference layer 33a, reference layer 33 is configured to have a self pinned magnetization that is established with a shape anisotropy and a coercive force (Hc) substantially larger than that of the free layer 40.

Figure 4:
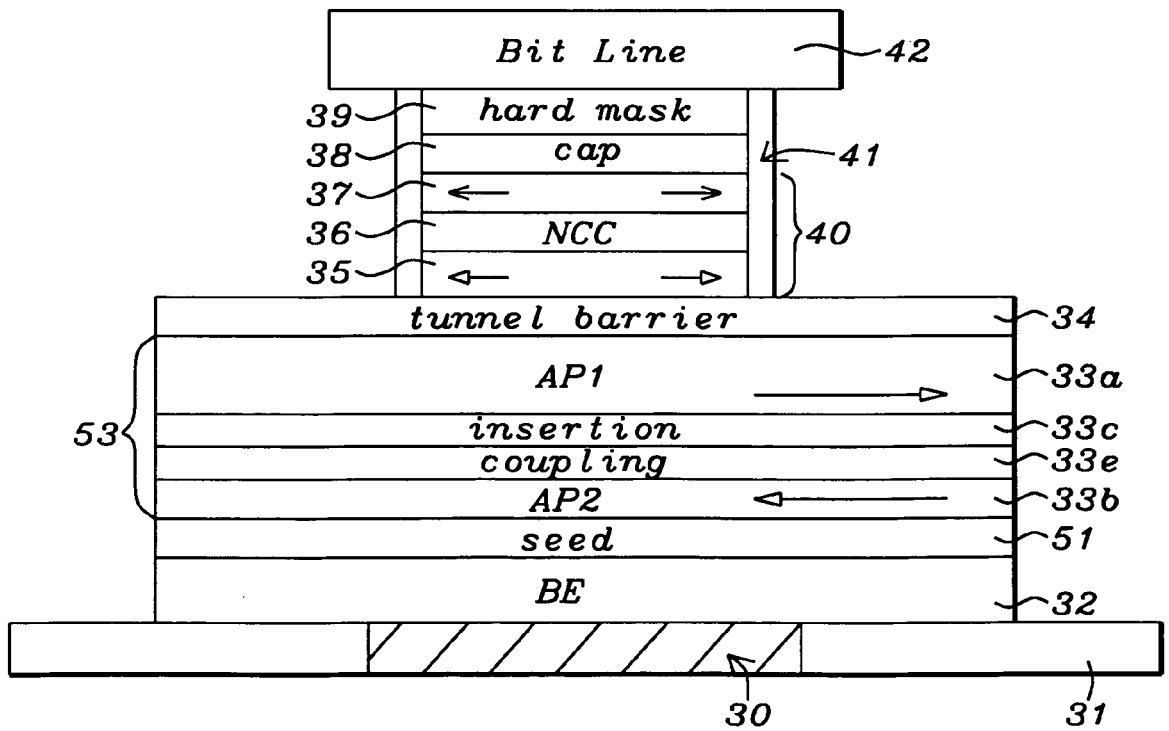
FIG. 4 is a cross-sectional view of a STT-RAM having a SyAP reference layer and a nanopillar stack formed according to a second embodiment of the present invention.

Referring to FIG. 4, a second embodiment is shown of a MTJ nanopillar formed between a bottom electrode 32 and a bit line 42. As in the first embodiment, the bottom electrode is preferably formed on a via stud 30 with connection to an underlying transistor (not shown) and that is formed in a dielectric layer 31. In this case, a reference layer 53 has a synthetic anti-ferromagnetic (SyAF) configuration with a lower magnetic layer 33b disposed on the seed layer 51, a middle coupling layer 33e, and an upper composite layer 33c/33a. Thus, the reference layer 53 has a $M_1$/coupling/X/$M_2$ configuration. The insertion layer 33c is formed on middle coupling layer 33e and upper magnetic layer 33a contacts the tunnel barrier layer 34. The middle coupling layer 33e is a non-magnetic spacer made of Ru, Rh, or Ir, for example and has a thickness of about 7.5 Angstroms to promote anti-ferromagnetic coupling between lower magnetic layer 33b and upper magnetic layer 33a.

In this embodiment, upper magnetic layer 33a also known as the SyAF reference layer or AP1 layer is configured with a self pinned magnetization by having a shape anisotropy and a coercive force (Hc) substantially larger than that of the free layer 40 and lower magnetic layer 33b which represents an AP2 layer. This self-pinning effect is achieved by having an AP1 thickness at least 2x greater than the AP2 layer 33b and at least 2x greater than the combined magnetic layer thickness in free layer 40, and a first area size substantially greater than the second area size of the free layer from a top view. For example, the first area size may be from 400% to 900% greater than the second area size. In this case, the dipolar field for the AP1 layer 33a may be smaller than that of the self pinned reference layer 33a in the first embodiment. Consequently, the thickness of the self-pinned AP1 layer 33a may be smaller than 40 to 60 Angstroms and the area size may be less than the self-pinned layer in FIG. 2. When the thickness of the AP1 layer 33a approaches that of the AP2 layer 33b thickness which is about 30 to 40 Angstroms, the area size of the SyAF reference layer 53 may be essentially the same as that of the free layer 40 and the upper nanopillar section. The insertion layer 33c thickness is preferably kept between 5 to 10 Angstroms to avoid degrading the anti-ferromagnetic coupling between the $M_1$ and $M_2$ layers.

In one embodiment, there is a passivation layer 41 made of silicon nitride or the like formed along the sidewalls of the upper nanopillar section in order to prevent oxidation of exposed portions of the free layer 40. The free layer 40 may be a composite with a lower ferromagnetic layer 35, a middle nanocurrent channel layer 36, and an upper ferromagnetic layer 37 which will be explained in a later section. In the exemplary embodiment, the bottom electrode 32 has essentially the same area size in the "x, y" plane as the other layers 51, 53, 34 in the bottom pedestal section. However, the present invention also anticipates that the bottom electrode 32 may have an area size in the "x, y" plane (from a top view) that is larger than the seed layer 51, composite reference layer 53, and tunnel barrier layer 34.

Figure 5:
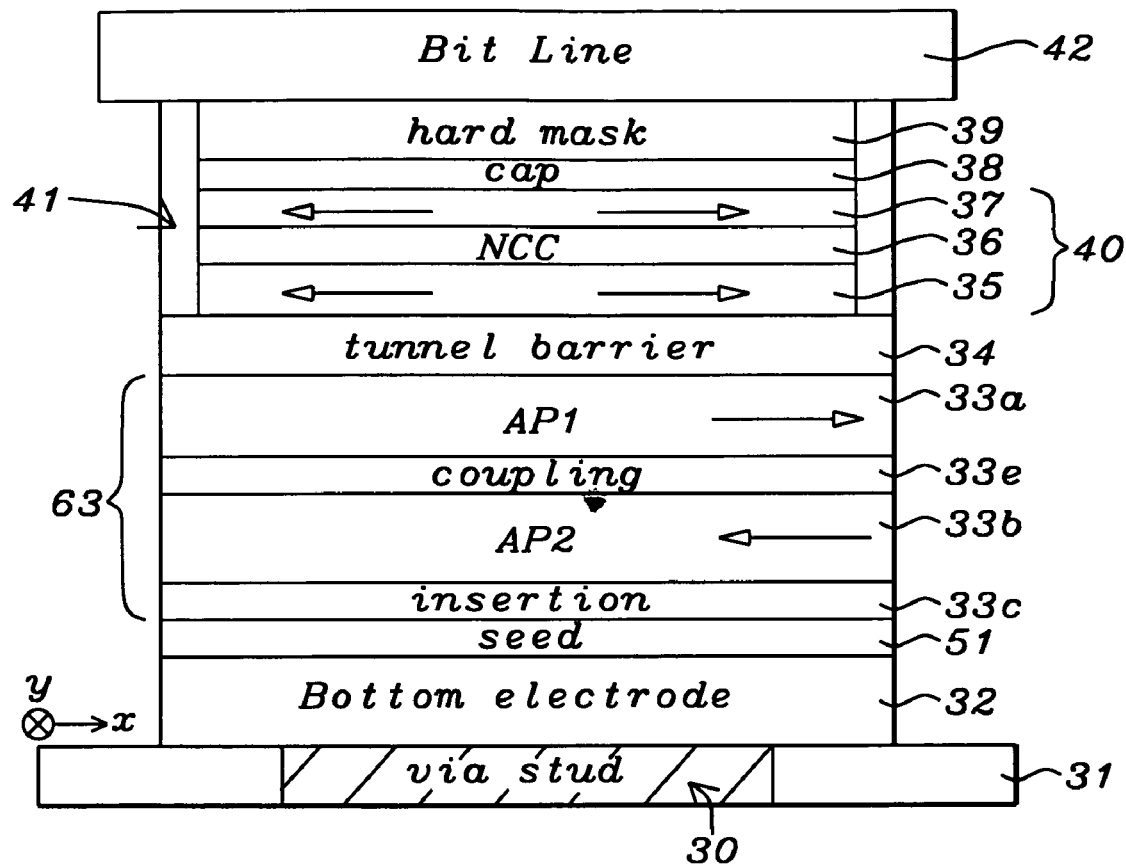
FIG. 5 is a cross-sectional view of a STT-RAM having a SyAP reference layer and a nanopillar stack formed according to a third embodiment of the present invention.
Figure 6:
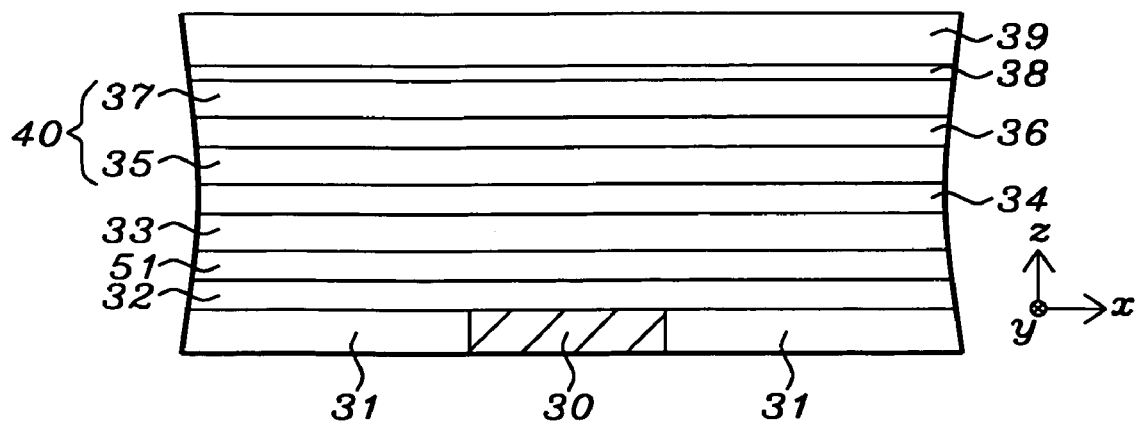
FIG. 6 is a cross-sectional view showing a stack of MTJ layers in a partially formed STT-RAM structure according to an embodiment of the present invention.

Referring to FIG. 5, a third embodiment of a nanopillar formed between a bottom electrode 32 and a bit line 42 is depicted. In this nanopillar structure, the bottom pedestal section comprised of the bottom electrode 32, seed layer 51, SyAF reference layer 63, and tunnel barrier layer 34 has an area size (from a top view) equal to or up to 1.1 to 1.2 times greater than that of the upper nanopillar section which includes free layer 40, capping layer 38, and hard mask 39. Note that the SyAF reference layer 63 may have a $X/M_1$/coupling/$M_2$ configuration wherein the insertion layer 33c is formed on the seed layer 51. Similar to the second embodiment, upper magnetic layer 33a is considered to be an AP1 reference layer and lower magnetic layer 33b is regarded as an AP2 reference layer. Optionally, SyAF reference layer 63 may be replaced by SyAF reference layer 53 having a $M_1/X$/coupling/$M_2$ configuration. The thickness of the upper magnetic layer 33a may be from 2 to 3 times greater than that of the combined thicknesses of the magnetic layers in free layer 40.

Free layer 40 is preferably a composite that includes a lower magnetic layer 35, a middle nanocurrent channel (NCC) layer 36, and an upper magnetic layer 37 and is disposed on the tunnel barrier 34. The magnetic layers 35, 37 are preferably made of CoFeB, CoFe, Fe, FeB having a low magnetic damping constant. Above the composite free layer 40 is a thin capping layer 38 which is preferably made of Ru. The top layer in the MTJ stack is a hard mask 39 comprised of Ta, TaN, Ti, or TiN, for example.

An important feature of all embodiments in the present invention is the composite free layer 40 that includes a middle NCC layer 36 made of FeSiO, FeSiN, RSiO, or RSiN where R is a Co, Ni, B, or a metal and RSiO and RSiN are composites in which conductive R(Si) grains such as Fe(Si) are magnetically and electrically coupled with the adjacent magnetic layers 35, 37, and are formed in a silicon oxide (or silicon nitride) insulator matrix. The R(Si) grains such as Fe(Si) are typically formed in columnar shapes that may extend from the lower magnetic layer 35 to the upper magnetic layer 37. High resolution transmission electron microscopy (HR-TEM) measurements indicate that a FeSiO layer is grown as a continuous film that is flat and smooth similar to the tunnel barrier layer 34. It is important to note that the two magnetic layers 35, 37 are ferromagnetically coupled and therefore have a magnetic moment in the same direction. For instance, the magnetization direction of magnetic layers 35, 37 may either be aligned parallel or anti-parallel to the magnetization direction of the AP1 reference layer 33a.

The present invention also anticipates that a small amount of B of up to about 5 atomic % may be added to a Fe magnetic layer 35, 37 in order to improve thermal stability. Thus, the magnetic layers 35, 37 may be represented by $FeB_x$ where x is between 0 and 5 atomic %.

In one embodiment, the composite free layer 40 has a FM1/FeSiO/FM2 or FM1/FeSiN/FM2 configuration wherein FM1 represents magnetic layer 35 and FM2 represents magnetic layer 37. For example, FM1 layer 35 may be made of CoFeB with a thickness from 10 to 15 Angstroms, NCC layer 36 may be comprised of FeSiO that is between 10 and 15 Angstroms thick, and FM2 layer 37 may be made of CoFeB with a thickness from 6 to 8 Angstroms. In the composite free layer 40 described herein, a spin current passes only through the conductive grains in the NCC layer 36 which will result in a high current density in the conductive magnetic grains and thus induce magnetic switching in the R(Si) portion of the NCC layer 36. Thermal heating caused by a localized high current density may also contribute to magnetization switching in the R(Si) grains. Because the R(Si) grains in NCC layer 36 are capable of undergoing magnetization switching (reversal), and are coupled to magnetic layers 35, 37 in the free layer 40, the magnetization switching of magnetic layers 35, 37 such as CoFeB will be much easier than when a NCC layer is not present in the free layer.

The bottom electrode layer 32, seed layer 51, and layers 33-39 are sequentially disposed on a substrate comprised of a via stud 30 and an adjacent first dielectric layer 31 made of silicon oxide, alumina, or the like. It should be understood that the via stud 30 is connected to a transistor drain (not shown) in an underlying substructure. The transistor is typically used in a write or read process that determines the resistance state of the bit cell (MTJ) once the MTJ stack of layers is patterned to form a MTJ nanopillar structure and contacts an overlying bit line. Note that unlike conventional MRAM, magnetization switching in a STT-RAM MTJ is accomplished by passing current through a bit cell and not by fields induced by current in a word line and a bit line. As in the second embodiment, the bottom electrode 32 may have an area size in the "x, y" plane greater than that of seed layer 51, composite reference layer 63 (or 53) and tunnel barrier 34.

Figure 9A:
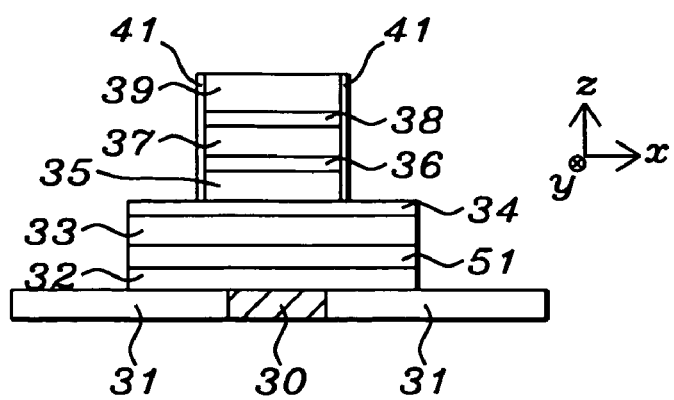
FIG. 9a is a cross-sectional view of the partially formed STT-RAM structure in FIG. 7 after the tunnel barrier layer, pinned layer, and bottom electrode are patterned to form a pedestal at the bottom of the MTJ nanomagnet pillar.
Figure 9B:
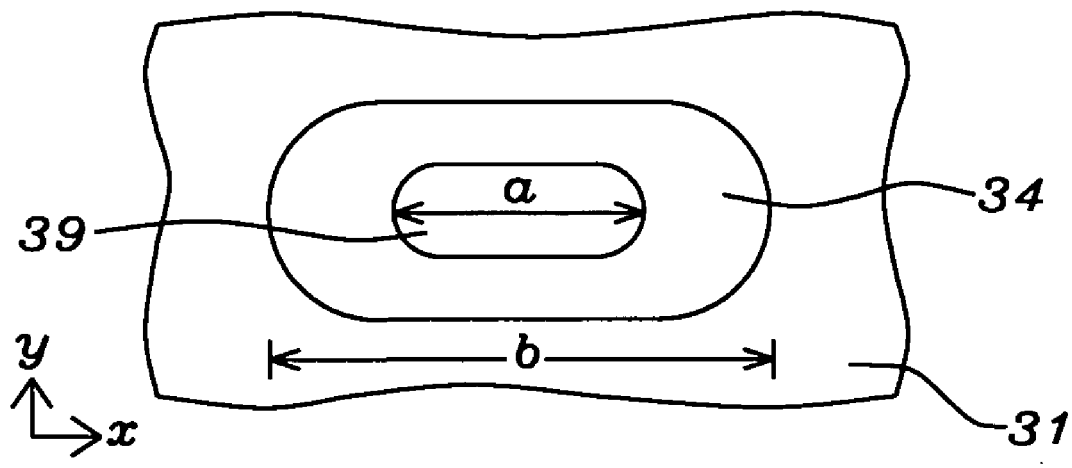
FIG. 9b is a top-down view of the partially formed STT-RAM structure in FIG. 8a that illustrates a substantially greater area size in the pedestal section than in the upper section of the MTJ nanomagnet pillar.

The MTJ stack comprised of the composite reference layer 33 (53 or 63), layers 34-39 and seed layer 51 may be formed in the same process tool as the bottom electrode layer 32. For instance, the bottom electrode 32 and MTJ stack may be formed in an Anelva C-7100 thin film sputtering system or the like which typically includes three physical vapor deposition (PVD) chambers each having five targets, an oxidation chamber, and a sputter etching chamber. At least one of the PVD chambers is capable of co-sputtering. Usually, the sputter deposition process involves an argon sputter gas and the targets are made of metal or alloys to be deposited on a substrate. The bottom electrode layer 32, seed layer 51, and overlying MTJ layers 33-39 may be formed after a single pump down of the sputter system to enhance throughput. Note that free layer 40 is a composite represented by the stack of layers 35-37. Alternatively, the composite reference layer 33 may be substituted with a single reference layer 33a as in FIG. 2 or with a SyAF reference layer 53, 63 as in FIG. 4 and FIG. 5, respectively. It should be understood that the insertion layer 33c may also be deposited by a sputter deposition method. During a subsequent high temperature annealing process, some intermixing may occur between the insertion layer 33c and the magnetic layer 33a (or with magnetic layer 33b) thereby enabling a substantially greater Hc and magnetostriction in the self-pinned reference layer 33a In a preferred embodiment, the MTJ stack of layers is fabricated into a MTJ cell (nanopillar) comprised of an upper section and a lower pedestal section as depicted in FIG. 9a. A nanopillar may also be referred to as a nanomagnet. The pedestal section is comprised of the seed layer 51, reference layer 33 (or 33a or 53 or 63), and an overlying tunnel barrier layer 34 formed on a bottom electrode 32 having essentially the same shape (FIG. 9b) as the tunnel barrier layer (and reference layer) from a top-down view. In one aspect, the top-down shape is substantially an ellipse that has a long easy axis (x-axis) and a short axis (y-axis). Alternatively, the upper nanopillar section and lower pedestal section may have an elongated shape wherein there are two parallel sides (parallel to the easy axis) in a middle section and two curved end sections that connect the parallel sides as in FIG. 9b. Substantial shape anisotropy is necessary to maintain the magnetization direction of the reference layer 33 along a certain direction such as the x-axis because an AFM layer is not used to pin the reference layer.

Returning to FIG. 9a, the composite free layer 40 is formed on the tunnel barrier layer 34. All of the layers 35-39 in the upper section have essentially the same shape which from a top-view (FIG. 9b) has an area substantially less than the area of the lower pedestal section. In one embodiment, the area of the pedestal section including tunnel barrier 34 is from 400% to 900% greater than the area of the upper section including hard mask 39 in order to minimize dipolar coupling between the reference layer 33 and composite free layer 40. In other words, the long axis b of the elongated shape representing the tunnel barrier 34 is from 2 to 3 times larger than the long axis a of the elongated shape representing the hard mask 39. Similar to the pedestal shape, the nanopillar shape from a top view may be substantially an ellipse or may be another shape as appreciated by those skilled in the art. The present invention also anticipates that the shape of the nanopillar may be different than that of the pedestal. In other words, layers 35-39 may have a first shape in the "x, y" plane and layers 32-34 may have a second shape in the "x, y" plane which is unequal to the first shape. In another embodiment, the area size of the pedestal section is from 0% to 20% greater than that of the upper section as represented by the STT-RAM structure in FIG. 5.

The thickness of the reference layer 33 is preferably greater than the combined thicknesses of the lower magnetic layer 35 and upper magnetic layer 37 in the composite free layer 40. Preferably, the thickness of the reference layer 33 is between 2 and 4 times larger than the combined thicknesses of magnetic layers 35, 37 to enable a substantially greater Hc in the reference layer 33 than in the free layer 40 so that the reference layer is maintained in a "self-pinned" magnetic state.

Embodiments where an AFM layer is included between the seed layer 51 and reference layer 33 (or 33a, 53, 63) are generally less preferred since the atomic spins are aligned in an anti-parallel configuration inside antiferromagnets and AFM materials have a high depolarization effect on a current passing through the MTJ thereby reducing the spin transfer effect in a spin transfer MTJ according to the J. Hayakawa reference mentioned previously. The "pinning" of the reference layer 33 is achieved because of a substantially larger shape anisotropy than in the composite free layer 40. The larger shape anisotropy is provided by the reference layer 33 having a substantially greater area in the "x, y" plane and a substantially greater thickness in the z-axis direction than the composite free layer 40. The seed layer 51 and/or insertion layer 33c may induce a higher damping constant in the reference layer 33 thereby further enhancing the "pinned" state of the reference layer 33a.

Above the reference layer 33 is a thin tunnel barrier layer 34 that is preferably MgO. Unlike a method commonly used in the prior art where a MgO tunnel barrier is formed by a RF sputter deposition from a MgO target, the inventors advantageously employ a procedure where a Mg layer about 6 to 8 Angstroms thick is sputter deposited followed by an in-situ natural oxidation (NOX), and then sputter deposition of an additional Mg layer about 3 to 5 Angstroms thick. The resulting MgO tunnel barrier is crystalline and highly (001) oriented. A NOX process is preferred over a radical oxidation (ROX) process in order to achieve a RA target in the range of 10-20 ohm-um$^2$ that is desired for STT-RAM devices. ROX processes tend to give higher RA values. The tunnel barrier layer 34 has excellent smoothness and uniformity in part because of the smooth underlying reference layer 33. The NOX process is preferably performed in an oxidation chamber within the sputter deposition system. NOX process conditions may be comprised of a 1 torr pressure and an oxygen flow rate of from 0.1 to 1.0 standard liters per minute (slm) and preferably 1 slm for about 100 to 300 seconds to oxidize the Mg layer on the reference layer 33.

It has been shown that a MTJ made with a crystalline (001) MgO barrier layer and a CoFeB free layer is capable of delivering a very high dR/R as described in the prior art references. High dR/R is a result of coherent tunneling in which electron symmetry of the ferromagnetic electrode is preserved in tunneling through the crystalline MgO barrier. Even though a CoFeB free layer has a somewhat higher intrinsic damping constant than a CoFe free layer, a CoFeB free layer has a high polarization after high temperature annealing which leads to significantly higher dR/R than a CoFe free layer.

The capping layer 38 is preferably a thin Ru layer in order to enhance the dR/R and considerably lower the critical current density Jc according to the Jiang reference mentioned previously. A substantial reduction in Jc occurs mainly because the Ru layer serves as a strong spin scatterer by effectively reflecting the polarized current and thereby enhancing spin accumulation at the interface between lower magnetic layer 35 and NCC layer 36, and at the interface between NCC layer 36 and upper magnetic layer 37. The enhanced spin accumulation will increase the polarized current inside the composite free layer 40. As a result, there will be additional spin torque to act on the free layer magnetization. The Ru layer is between 5 and 15 Angstroms thick to achieve a strong spin scattering effect and is preferably about 5 to 10 Angstroms thick when annealing temperatures above 350° C. are employed. We have found that a thicker Ru capping layer 38 will cause a reduction in dR/R due to increased resistance R.

A hard mask layer 39 that may be comprised of Ta is formed on the capping layer 38 and has sufficient thickness to prevent excessive thinning of the MTJ stack of layers during subsequent processing steps. It is well known that variations in MTJ stack height because of excessive thinning during a chemical mechanical polish (CMP) step, for example, can degrade device performance. In one aspect, the Ru/Ta configuration may be considered a composite capping layer since the Ru capping layer 38 and Ta hard mask layer 39 are formed as the upper two layers in the MTJ during the same patterning sequence that defines the MTJ nanopillar. Optionally, a TaN, Ti, or TiN hard mask 39 may be used.

Figure 7:
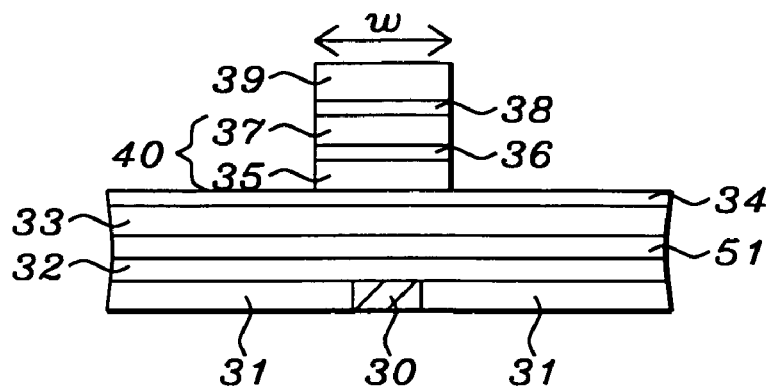
FIG. 7 is partially formed STT-RAM in which the upper layers in the MTJ stack in FIG. 5 have been patterned to form an upper section of a MTJ nanomagnet pillar.

Referring to FIG. 7, a process step is shown whereby the upper section of the MTJ nanopillar is formed from the MTJ layers 35-39. A first photoresist layer (not shown) is coated and patterned on the hard mask layer 39 to form a pattern comprised of a first array of islands wherein each island corresponds to the desired ellipse shape or another shape of the upper nanopillar section. The patterned first photoresist layer then functions as an etch mask during a first reactive ion etch (RIE) process in a RIE system mainframe which removes uncovered regions of the hard mask layer 39 that is preferably Ta and stops on the capping layer 38. Thereafter, the first photoresist layer may be stripped and a second RIE process is employed to selectively etch through regions of the capping layer 38 which is preferably Ru and composite free layer 40 (layers 35-37) that are not protected by the hard mask 39. As a result, an upper nanopillar section having a width w and comprised of a composite free layer 40, capping layer 38, and hard mask layer 39 is formed on the tunnel barrier layer 34. Preferably, the upper nanopillar section is formed above via stud 30 to enable more MTJ nanopillar structures per unit area to be formed in the STT-RAM array (not shown) which has a plurality of MTJ nanopillars.

Figure 8:
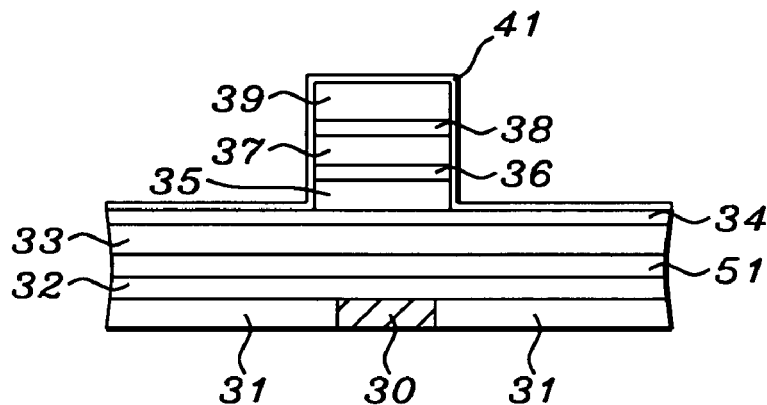
FIG. 8 is a cross-sectional view of the partially formed STT-RAM structure in FIG. 6 after a silicon nitride layer is deposited on the MTJ nanomagnet pillar and on the surrounding tunnel barrier layer.

Referring to FIG. 8, a passivation layer 41 such as silicon nitride is deposited insitu on the upper nanopillar section and on the surrounding tunnel barrier layer 34. In one embodiment, a physical vapor deposition (PVD) method or the like is used to form a conformal coating of passivation layer 41 such that the thickness of the passivation layer on the upper nanopillar section and on the tunnel barrier layer 34 is essentially the same across the STT-RAM array. To avoid oxidizing the free layer sidewalls, this step may be performed in a sputter deposition chamber within a RIE system mainframe.

Referring to FIG. 9a, a second photoresist layer (not shown) is coated and patterned on the passivation layer 41 to form a second array of islands wherein each island (not shown) is formed above an upper nanopillar section and has the desired shape of the lower pedestal section in the "x,y" plane. The second photoresist layer then functions as an etch mask during a third RIE process that removes portions of the passivation layer 41, tunnel barrier layer 34, composite reference layer 33 (53, or 63), seed layer 51, and bottom electrode 32 that are not protected by the etch mask. The third RIE process stops on the first dielectric layer 31. In the exemplary embodiment, the second photoresist layer may be consumed during the latter part of the third RIE step and as a result horizontal portions of the passivation layer 41 on the hard mask layer 39 and tunnel barrier layer 34 are also removed by the etch process. Vertical portions of passivation layer 41 remain along the sidewalls of the upper section of the MTJ nanopillar so that the free layer 40 is protected from oxidation when the partially formed MTJ nanopillar is exposed to air during transfer between chambers in the sputter deposition mainframe.

The present invention anticipates an additional embodiment wherein the third etch step stops on the bottom electrode 32. Subsequently, the bottom electrode layer 32 is etched to form a bottom electrode with an area size greater than that of the reference layer 33 from a top view (not shown). However, this embodiment is not preferred since MTJ nanopillar density in the STT-RAM array will be reduced.

Figure 10:
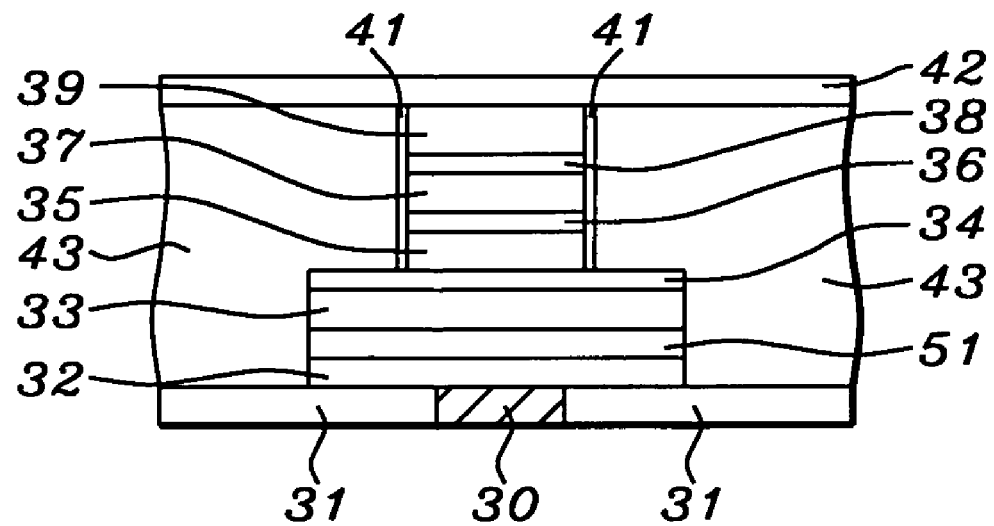
FIG. 10 is a cross-sectional view that shows a completed STT-RAM device after a dielectric layer is formed adjacent to the MTJ nanomagnet pillar in FIG. 9a and a bit line is fabricated on the dielectric layer and MTJ nanomagnet pillar.

Referring to FIG. 10, after the second photoresist layer is stripped, a second dielectric layer 43 made of silicon oxide, alumina, or another insulator material is deposited on the first dielectric layer 31 and on the MTJ nanopillar comprised of the upper section and lower pedestal section. In the preferred embodiment, the bottom electrode 32 has the same area shape in the "x,y" plane as the reference layer 33 and is considered part of the lower pedestal section. A CMP process is used to expose the hard mask layer 39 and planarize the second dielectric layer 43 to become coplanar with the hard mask layer. Then a conductive material such as Cu, Al, or alloys thereof may be deposited on the second dielectric layer 43 and over the hard mask 39. Next, a bit line 42 that contacts the hard mask 39 is delineated by patterning the conductive layer using a well known photoresist patterning and etching sequence.

It should be understood that the nanopillar structures included in the second embodiment (FIG. 4) and in the third embodiment (FIG. 5) may also be fabricated with a similar process sequence to that described with respect to FIGS. 7-10 wherein the upper nanopillar section is patterned followed by formation of a passivation layer 41 along the sidewalls of the free layer 40, capping layer 38, and hard mask 39. Then the bottom pedestal section is patterned. Thereafter, the second dielectric layer 43 is deposited and planarized before the bit line 42 is formed.

An important advantage of the nanopillars described herein compared with a conventional MTJ comprised of an AFM layer where Mn can diffuse into a tunnel barrier layer during high temperature annealing is that the "self-pinned" reference layer enables an annealing temperature greater than 375° C. which leads to a higher dR/R. The high temperature annealing is preferably performed after all of the MTJ layers have been deposited and before the upper nanopillar section and lower pedestal section are patterned. For example, in the exemplary embodiments, the MTJ stack of layers between the bottom electrode 32 and bit line 42 may be annealed in a vacuum by applying a magnetic field of 5000 to 10000 Oe in magnitude along the x-axis (easy axis) for 1 to 5 hours at a temperature of about 330° C. to 400° C.

Comparative Example 1

An experiment was conducted to demonstrate the improved performance of a MTJ fabricated with a thin Ru capping layer and high temperature annealing. In this example, an AFM layer is included in the stack between the seed layer and pinned layer so that dR/R and RA can be measured by CIPT on an unpatterned stack of layers. Magnetic properties were measured for magnetic nanopillars that have various thicknesses of a Ru capping layer. In particular, incorporation of a thin Ru capping layer having a 5 Angstrom thickness in a STT-RAM MTJ was found to deliver significantly better performance than one with a 30 Angstrom Ru capping layer thickness that had previously been fabricated by the inventors. The MTJ stack for all configurations shown in Table 1 is formed on a Ta/Ru200/α-Ta100 bottom electrode and has the following succession of layers in order from bottom to top: 45 Angstrom NiCr seed layer; 150 Angstrom MnPt AFM layer; $Co_{75}Fe_{25}23/Ru7.5/Co_{40}Fe_{40}B_{20}15$-$Co_{75}Fe_{25}6$ SyAF pinned layer; MgO tunnel barrier; free layer; Ru capping layer, and a Ta/Ru hard mask in which Ta thickness is 30 Angstroms and Ru thickness is 100 Angstroms. Note that a Ta/Ru hard mask is used in this example but a Ta hard mask is preferred in a STT-RAM structure. The 100 Angstrom thick Ru layer is used in this example only for the purpose of establishing good electrical contact for a CIPT measurement. The MgO layer was formed by first depositing an 8 Angstrom thick Mg layer followed by a NOX process (0.6 slm $O_2$ for 200 seconds) and then deposition of a 4 Angstrom thick Mg layer. Annealing was performed for 1 hour at the indicated temperature. Magnetic properties were measured using CIPT and a B-H looper.

TABLE 1

Magnetic Properties of STT-RAM MTJs with NiCr45/MnPt150/$Co_{75}Fe_{25}23$/
Ru7.5/$Co_{40}Fe_{40}B_{20}15$-$Co_{75}Fe_{25}6$/MgO(NOX)/free layer/Ru capping/Ta/Ru configuration

| Row | FL | Anneal (1 hour) | Ru cap | RA | dR/R | Bs | Hc | He | Hk |
|---|---|---|---|---|---|---|---|---|---|
| 1 | CoFeB14/FeSiO/10/CoFeB6 | 330 C | 5 | 15.8 | 117% | 0.58 | 13.1 | 4.38 | 23.4 |
| 2 | CoFeB14/FeSiO/10/CoFeB6 | 330 C | 10 | 19.0 | 93% | 0.60 | 13.2 | 5.74 | 25.8 |
| 3 | CoFeB14/FeSiO/10/CoFeB6 | 330 C | 30 | 19.8 | 91% | 0.59 | 14.3 | 5.14 | 27.6 |

Row 3 in Table 1 represents the reference sample and has a CoFeB/FeSiO/CoFeB free layer configuration that is capped with a 30 Angstrom thick Ru layer. RA is around 20 ohm-$\mu m^2$ and dR/R is 91%. In a separate experiment, the dR/R for a similar MTJ (30 Angstrom thick Ru cap and 330° C. annealing) was found to be 80% for a 100 nm×150 nm oval nanomagnet. As shown in Row 1, when the Ru capping layer thickness is decreased to 5 Angstroms, the dR/R increases significantly to 117%.

For a MTJ nanopillar formed according to an embodiment described herein which includes a "self-pinned" reference layer with no AFM layer, post-deposition annealing can be performed at a higher temperature up to about 400° C. that is expected to yield an even larger dR/R than shown in Row 1 of Table 1. Thus, a dR/R substantially greater than 117% can be achieved when a MTJ having a "self-pinned" reference layer formed according to the present invention is annealed above 330° C. such as at 375° C.

In a related experiment, high speed measurements were performed on MTJ nanopillars (nanomagnets) having a 30 Angstrom thick Ru capping layer. The sample in Row 3 of Table 1 and a second sample where the composite free layer was replaced with a CoFeB free layer having a 20 Angstrom thickness were patterned into a 100 nm×150 nm oval shapes with essentially vertical sidewalls such that the upper nanopillar section has essentially the same area size as the lower pedestal section from a top view (not shown). Results show that $Jc_0$ for the nanomagnet with a CoFeB free layer is about $7 \times 10^6$ A/cm$^2$ and the $Jc_0$ for the nanomagnet derived from the Row 3 sample is approximately $2.5 \times 10^6$ A/cm$^2$. Therefore, the intrinsic critical current density was reduced by over 60% by employing a composite free layer with a FeSiO NCC layer rather than a single CoFeB free layer.

According to the present invention, the combination of a thin Ru capping layer and a composite free layer which includes a NCC layer in a STT-RAM MTJ results in a higher dR/R and lower critical current density $Jc_0$ than is achieved in the prior art where a single CoFeB free layer is employed. Further improvement is accomplished through a MTJ design of the present invention where a smaller upper nanopillar section containing the composite free layer is formed on a larger lower pedestal section containing the a "self-pinned" reference layer so that the shape anisotropy and Hc of the pedestal section is substantially greater than that of the upper section. Dipole interaction between the free layer and reference layer is also minimized thereby improving the switching performance of a STT-RAM MTJ. The CoFeB/FeSiO/CoFeB free layer can be readily implemented with existing tools and processes. A method has been provided such that the MTJ nanopillar design described herein can be easily reproduced.

While this invention has been particularly shown and described with reference to, the preferred embodiment thereof, it will be understood by those skilled in the art that various changes in form and details may be made without departing from the spirit and scope of this invention.

We claim:

1. A MTJ nanopillar structure in a STT-RAM device, comprising:
    (a) a first stack of layers with sidewalls formed on a bottom electrode and having a thickness in a direction perpendicular to said bottom electrode and a first shape with a first area in a plane orthogonal to said thickness direction, comprising;
        (1) a seed layer on the bottom electrode;
        (2) a composite reference magnetic layer formed on the seed layer and comprised of at least one magnetic layer and an insertion layer wherein the at least one magnetic layer is a reference layer in a "self-pinned" state with a first thickness and a magnetization direction along an easy axis direction in a plane orthogonal to said thickness direction; and
        (3) a tunnel barrier layer on the "self-pinned" reference magnetic layer
    (b) a second stack of layers with sidewalls formed on the first stack of layers and having a thickness in a direction perpendicular to said bottom electrode and a second shape with a second area substantially less than the first area in a plane orthogonal to said thickness direction; comprising
        (1) a composite free layer having a FM1/NCC/FM2 configuration wherein NCC is a nanocurrent channel layer comprised of R(Si) grains formed in an oxide or nitride insulator matrix and R is Fe, Ni, Co, or B, and the FM1 and FM2 layers are magnetic layers having a combined thickness substantially less than the first thickness of the reference layer;
        (2) a Ru capping layer on the composite free layer; and
        (3) a hard mask formed on the capping layer.

2. The MTJ nanopillar structure of claim 1 wherein the bottom electrode is comprised of Ta/Ru/Ta or Ta and has the same first shape as the first stack of layers.

3. The MTJ nanopillar structure of claim 1 wherein the composite reference layer is a comprised of a lower insertion layer made of Tb, Gd, Pt, Pd, Ta, Hf, Os, Nb, Rh, or Ru formed on the seed layer, and an upper "self-pinned" reference layer comprised of Co, Fe, Ni, B or an alloy thereof that contacts said tunnel barrier layer.

4. The MTJ nanopillar structure of claim 1 wherein the composite reference layer has a $M_1/X/M_2$ configuration where $M_1$ and $M_2$ are magnetic layers made of Co, Fe, Ni, B, or an alloy thereof, X is an insertion layer comprised of Tb, Gd, Pt, Pd, Ta, Hf, Os, Nb, Rh, or Ru that induces an enhanced damping constant in the $M_1$ and $M_2$ layers, and the $M_2$ magnetic layer is a "self-pinned" reference layer.

5. The MTJ nanopillar structure of claim 1 wherein the composite reference layer is a synthetic anti-ferromagnetic (SyAF) layer represented by a $M_1/coupling/X/M_2$ configuration where $M_1$ and $M_2$ are magnetic layers made of Co, Fe, Ni, B, or an alloy thereof, X is an insertion layer comprised of Tb, Gd, Pt, Pd, Ta, Hf, Os, Nb, Rh, or Ru that induces an enhanced damping constant in the $M_2$ layer, the coupling layer is a non-magnetic layer made of Ru, Rh, or Ir, and the $M_2$ layer is a "self-pinned" reference layer.

6. The MTJ nanopillar structure of claim 1 wherein the NCC layer is comprised of FeSiO or FeSiN and the FM1 and FM2 magnetic layers are comprised of CoFeB, CoFe, FeB, or Fe.

7. The MTJ nanopillar structure of claim 1 wherein the first area is about 400% to 900% greater than the second area and the first thickness is at least two times larger than the combined thickness of the FM1 and FM2 layers.

8. The MTJ nanopillar structure of claim 1 wherein the Ru capping layer has a thickness from about 5 to 15 Angstroms and the hard mask is comprised of Ta, TaN, Ti, or TiN.

9. The MTJ nanopillar structure of claim 1 further comprised of a passivation layer formed along the sidewalls of the second stack of layers.

10. A MTJ nanopillar structure in a STT-RAM device, comprising:
    (a) a first stack of layers formed on a bottom electrode and having a thickness in a direction perpendicular to said bottom electrode and a first shape with a first area in a plane orthogonal to said thickness direction, comprising;
        (1) a seed layer formed on said bottom electrode;
        (2) a composite SyAF reference magnetic layer formed on the seed layer and comprised of a AP1 and AP2 magnetic layers, an anti-ferromagnetic coupling layer, and an insertion layer wherein the AP1 magnetic layer contacts an overlying tunnel barrier layer and is in a "self-pinned" state with a first thickness and a magnetization direction along an easy axis direction in a plane orthogonal to said thickness direction; and
        (3) a tunnel barrier layer on the "self-pinned" reference magnetic layer
    (b) a second stack of layers with sidewalls formed on the first stack of layers and having a thickness in a direction perpendicular to said bottom electrode and a second shape with a second area in a plane orthogonal to said thickness direction, said first area is from 0% to about 900% greater than the second area; comprising
        (1) a composite free layer having a FM1/NCC/FM2 configuration wherein NCC is a nanocurrent channel layer comprised of R(Si) grains formed in an oxide or nitride insulator matrix and R is Fe, Ni, Co, or B, and the FM1 and FM2 layers are magnetic layers having a combined thickness substantially less than the first thickness of the reference layer;
        (2) a Ru capping layer on the composite free layer; and
        (3) a hard mask formed on the capping layer.

11. The MTJ nanopillar structure of claim 10 wherein the bottom electrode is comprised of Ta or Ta/Ru/Ta and has the same first shape as the first stack of layers.

12. The MTJ nanopillar structure of claim 10 wherein the composite SyAF reference layer has a $X/M_1/coupling/M_2$ configuration where $M_1$ is an AP2 layer, $M_2$ is a "self-pinned" AP1 reference layer, $M_1$ and $M_2$ are comprised of Co, Fe, Ni, B, or an alloy thereof, X is an insertion layer comprised of Tb, Gd, Pt, Pd, Ta, Hf, Os, Nb, Rh, or Ru that induces an enhanced damping constant in the $M_1$ layer, and the coupling layer is a non-magnetic layer comprised of Ru, Rh, or Ir.

13. The MTJ nanopillar structure of claim 10 wherein the composite SyAF reference layer has a $M_1/coupling/X/M_2$ configuration where $M_1$ is an AP2 layer, $M_2$ is a "self-pinned" AP1 reference layer, $M_1$ and $M_2$ are comprised of Co, Fe, Ni, B, or an alloy thereof, X is an insertion layer comprised of Tb, Gd, Pt, Pd, Ta, Hf, Os, Nb, Rh, or Ru that induces an enhanced damping constant in the $M_2$ layer, and the coupling layer is a non-magnetic layer comprised of Ru, Rh, or Ir.

14. The MTJ nanopillar structure of claim 10 wherein the NCC layer is made of FeSiO or FeSiN and the FM1 and FM2 magnetic layers are comprised of CoFeB, CoFe, FeB, or Fe.

15. The MTJ nanopillar structure of claim 10 wherein the Ru capping layer has a thickness from about 5 to 15 Angstroms and the hard mask is comprised of Ta or TaN, Ti, or TiN.

16. The MTJ nanopillar structure of claim 10 further comprised of a passivation layer formed along the sidewalls of the second stack of layers.

* * * * *